United States Patent [19]
Wagner

[11] 3,980,504
[45] Sept. 14, 1976

[54] THERMOCOUPLE STRUCTURE
[76] Inventor: Edmond M. Wagner, 457 N. Lima, Sierra Madre, Calif. 91024
[22] Filed: June 4, 1973
[21] Appl. No.: 366,730

Related U.S. Application Data
[60] Continuation-in-part of Ser. No. 217,505, Jan. 13, 1972, abandoned, which is a division of Ser. No. 118,757, Feb. 25, 1971, Pat. No. 3,774,297, which is a continuation-in-part of Ser. No. 82,762, Oct. 21, 1970, Pat. No. 3,741,816, which is a continuation-in-part of Ser. No. 734,512, June 3, 1968, Pat. No. 3,556,864.

[52] U.S. Cl. .............................. 136/228; 136/217; 136/227; 136/233
[51] Int. Cl.² ........................................... H01V 1/02
[58] Field of Search .................... 136/917–220, 136/228, 227, 230, 233

[56] References Cited
UNITED STATES PATENTS

| 1,557,387 | 10/1925 | Thwing | 136/228 |
| 2,012,112 | 8/1935 | States | 136/233 |
| 2,385,530 | 9/1945 | Paille | 136/220 |
| 2,720,615 | 10/1955 | Betz | 136/228 |
| 2,837,618 | 6/1958 | Gildart | 136/228 |
| 2,858,350 | 10/1958 | Fritts et al. | 136/217 |
| 2,892,879 | 6/1959 | Fritts et al. | 136/228 |
| 2,943,132 | 6/1960 | Jackson | 136/219 |
| 3,038,950 | 6/1962 | Hajny | 136/217 |
| 3,332,808 | 7/1967 | Ray | 136/228 |
| 3,395,051 | 7/1968 | Pisarz | 136/233 |

FOREIGN PATENTS OR APPLICATIONS

| 165,324 | 10/1904 | Germany | 136/233 |
| 463,674 | 7/1928 | Germany | 136/233 |
| 12,708 | 4/1914 | United Kingdom | 136/228 |

Primary Examiner—Harvey E. Behrend
Attorney, Agent, or Firm—Christie, Parker & Hale

[57] ABSTRACT

A length of metallic wire is positioned inside a length of metallic tube in approximate axial alignment with the tube. A short sleeve is placed around the end of the wire. The sleeve is a different metal from the tube. The difference between the thermoelectric coefficients of the sleeve metal and the wire metal is larger than the difference between the thermoelectric coefficients of the tube metal and the wire metal. The tube metal is more resistant of oxidation than the sleeve metal.

8 Claims, 12 Drawing Figures

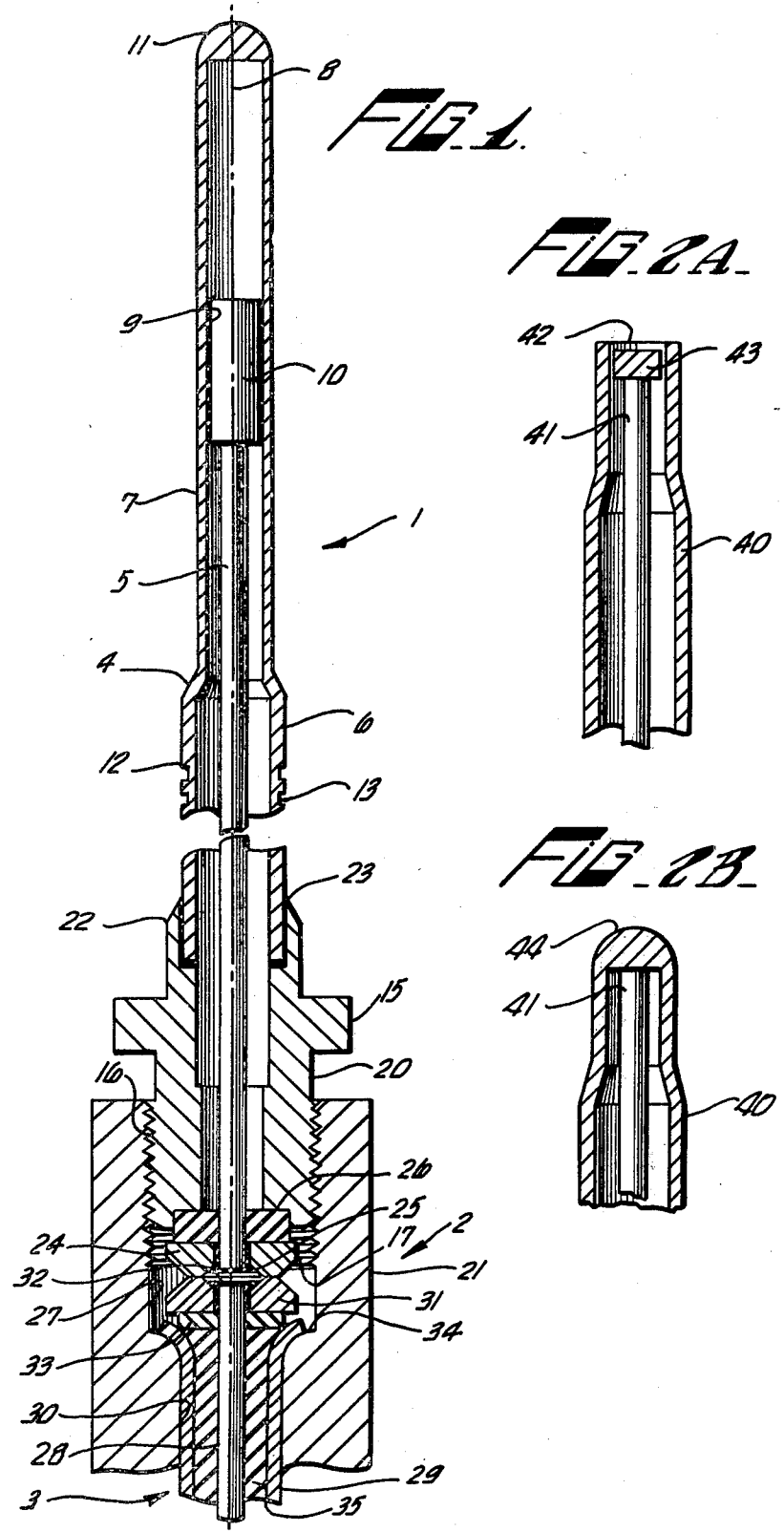

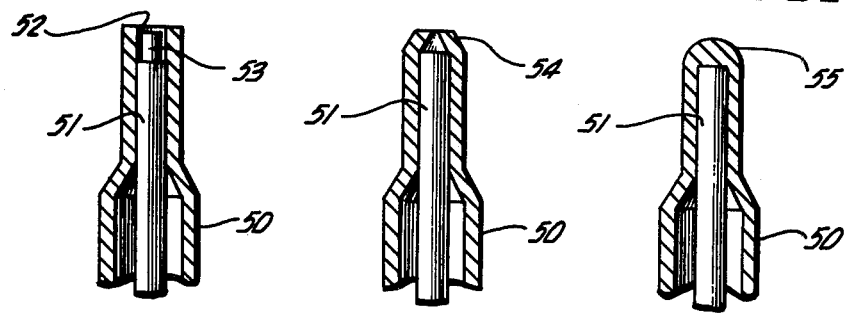
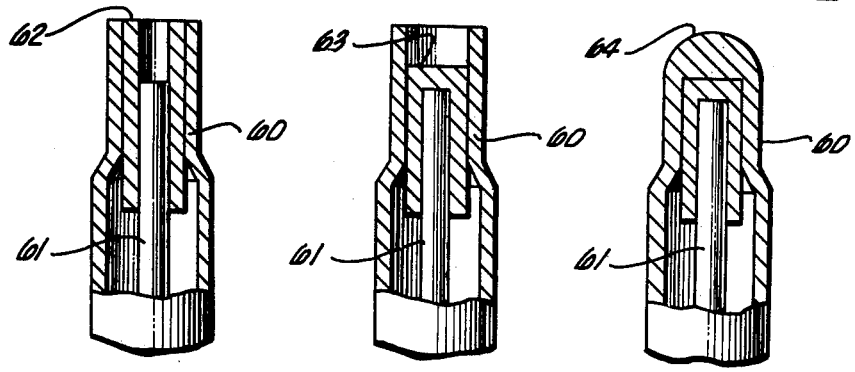
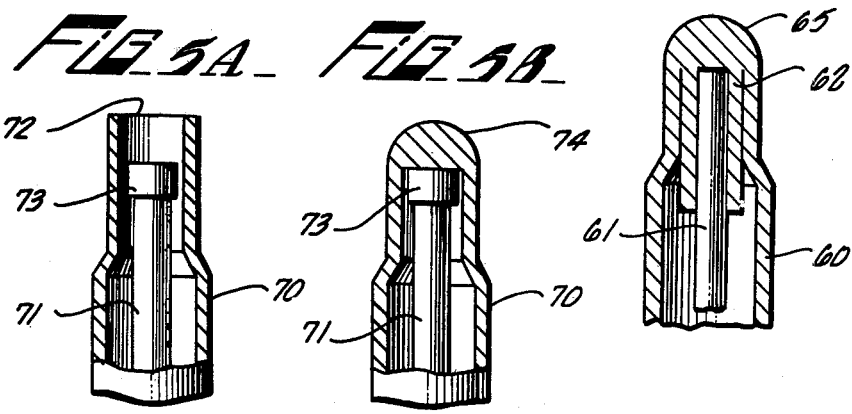

THERMOCOUPLE STRUCTURE

CROSS REFERENCE TO RELATED APPLICATIONS

This application is a continuation-in-part of application Ser. No. 217,505, filed Jan. 13, 1972, now abandoned, which is a division of my copending application Ser. No. 118,757, filed Feb. 25, 1971, now U.S. Pat. No. 3,774,297, which is a continuation-in-part of my copending application Ser. No. 82,762, filed on Oct. 21, 1970, now U.S. Pat. No. 3,741,816, which is a continutation-in-part of my U.S. Pat. No. 3,556,864, which issued on Jan. 19, 1971 and was filed on June 3, 1968.

BACKGROUND OF THE INVENTION

This invention relates to thermocouples and, more particularly, to thermocouple structures especially suited for use in the pilot burner of a gas heater.

Conventionally, the thermocouple used in a target-type pilot burner, of which the pilot burner disclosed in U.S. Pat. No. 3,291,185 issued to Harold A. McIntosh et al., is typical, comprises a length of wire and a length of tube made from dissimilar metals. The length of wire, which has an appreciably smaller diameter than the inside diameter of the tube, lies inside the tube in axial alignment therewith. Preferably, the extremity of the tube against which the flame of the pilot burner impinges has a smaller diameter and wall thickness than the base of the tube so as to promote large heat transfer radially inward through the extremity and small heat transfer axially from the extremity to the base of the tube. A tip is formed on the end of the extremity of the tube to seal its interior from the atmosphere and to form a hot thermocouple junction between the extremity of the tube and the adjacent end of the wire. A pair of leads, permanently joined respectively to the base of the tube and the adjacent end of the wire, connect the thermocouple to an electrical measuring instrument, or electrical coil, operating a control device.

The tube is made from a nonoxidizable metal such as stainless steel, but the wire is generally made from an oxidizable metal. If the seal at the extremity of the tube is imperfectly formed by the tip, oxidation of the wire takes place and the hot thermocouple junction deteriorates. The diameter of the wire is appreciably smaller than the inside diameter of the tube to avoid the possibility of a short circuit through contact between the wire and the tube at a point other than the hot junction. As a result, it is difficult to center the end of the wire sufficiently in the open area at the end of the extremity of the tube while the tip is being welded. Eccentricity between the end of the tube and the wire tends to cause an uneven distribution of the metals in the metallic weld bead forming the tip. As a result, stringers of the wire material may be produced in the tip that are eventually oxidized, leaving the tip porous. If more heat is used to form the tip in an attempt to eliminate imperfect seals, the danger exists that too much admixture of the dissimilar metals occurs at the tip to form an efficient hot junction. The problem of imperfect seals at the tip becomes especially acute if the tip forming operation is automated by use of heliarc equipment.

SUMMARY OF THE INVENTION

The invention involves a short sleeve placed over the end of a wire. The sleeve can be open or closed at its end. The hot thermocouple junction is formed between the adjacent surfaces of the sleeve and the wire. A feature of the invention is the use of a different metallic composition for the sleeve than for the tube. For the sleeve is selected a metallic composition that is the most effective thermoelectric generator with the metal of the wire. For the tube is selected a metallic composition that is most resistant to oxidation.

BRIEF DESCRIPTION OF THE DRAWINGS

The features of specific embodiments of the invention are illustrated in the drawings, in which:

FIG. 1 is a side elevation view in section of a thermocouple structure of the type in which the invention is used;

FIGS. 2A and 2B are side elevation views in section of one embodiment of the extremity end of a tube, respectively, before and after the formation of the tip;

FIGS. 3A and 3B are side elevation views in section of another embodiment of the extremity end of tubes before the formation of the tip, and FIG. 3C is a side elevation view in section of the same tubes after the formation of the tip;

FIGS. 4A and 4B are side elevation views in section of a further embodiment of the extremity end of tubes before the formation of the tip, and FIGS. 4C and 4D are side elevation views in section of FIGS. 4A and 4B after the formation of the tip, respectively; and FIGS. 5A and 5B are side elevation views in section of another embodiment of the extremity end of a tube, respectively, before and after the formation of the tip.

DESCRIPTION OF SPECIFIC EMBODIMENTS

Reference is made to application Ser. No. 118,757 for a description of FIGS. 1, 2A, 2B, 3A, 3B, 3C, 5A, and 5B. The disclosure of said application is incorporated herein by reference.

The claims of the present application are directed to the structure of FIGS. 4A through 4D. In FIG. 4A, a tube 60 and a wire 61 are shown. A tight-fitting open end sleeve 62 is placed over the end of wire 61. Then wire 61 with sleeve 62 is placed in tube 60 such that the end of wire 61 is set in slightly from the end of tube 60 and tube 60 and sleeve 62 are approximately flush. The outside diameter of sleeve 62 is sufficiently smaller than the inside diameter at the end of tube 60 to fit loosely or tightly therein. Sleeve 62 is made from a metal that is different from tube 60. Sleeve 62 is short in relation to the length of tube 60 and wire 61. Before or after placing wire 61 and sleeve 62 in tube 60, sleeve 62 is spot-welded to wire 61 to form a hot thermocouple junction therebetween. At the same time, the spot-welding may be used to establish a good electrical contact between tube 60 and sleeve 62 if the hot thermocouple junction is formed after placement in tube 60.

In FIG. 4B, a closed ended sleeve 63 replaces sleeve 62. Sleeve 63 is treated in the same manner in the course of the formation of a thermocouple as sleeve 62. It simple provides greater protection of the end of wire 61 from the heat during formation of the sealed tip and a more uniform tip weld bead. Alternatively, an open ended sleeve covered by a slug of material, as slug 73 in FIG. 5, could be employed. As illustrated in FIGS. 4C and 4D, sealed tips 64 and 65 are formed on the end of tube 60 when the end of tube 60 is welded shut by application of heat. FIG. 4C illustrates open-ended sleeve 62 after the tip has been formed, and FIG. 4D illustrates close-ended sleeve 63 after the tip has been formed.

Special advantage is derived from making sleeves 62 and 63 from different compatible compositions. In this way, there can be selected for the tube a composition which is highly resistant to oxidation and for the sleeve a composition which forms the most efficient thermoelectric generator with the metal of the wire, i.e., will generate the largest voltage for a given temperature difference between junctions. For example, the wire could be made from copel, the sleeve could be made from stainless steel 403, and tube 60 could be made from stainless steel 430. The difference between the thermoelectric coefficients of stainless steel 403 and copel is larger than the difference between the thermoelectric coefficients of stainless steel 430 and copel. (The term "thermoelectric coefficient" is used herein in the manner defined in the text, *Electricity and Magnetism*, by Francis Weston Sears, Addison Wesley Publishing Company, Inc. 1953, pp. 160–168.) However, stainless steel 430 is more resistant to oxidation than stainless steel 403. In summary, the metals of the components of the thermocouple are selected so that the difference between the thermoelectric coefficients of the sleeve metal and the wire metal is larger than the difference between the thermoelectric coefficients of the tube metal and the wire metal; thus, since the hot thermocouple junction is formed between the sleeve and tube, a larger voltage can be generated for a given temperature difference between thermocouple junctions, than could be generated if the hot thermocouple junction were formed between the tube and the wire.

*Preferably, the tube and sleeve metals are selected so any secondary thermoelectric voltage generated therebetween will add to the voltage generated between the sleeve metal and the wire metal.

Another advantage can be derived from using a different metal for the sleeve, namely, that a precious metal can be used as one element of the thermocouple junction to improve the thermoelectric generation without undue expense. The sleeve requires much less metal than the tube.

Another advantage in the described thermocouple structure is that a sharp, well defined hot thermocouple junction can be formed, i.e., little admixing of the metals takes place, because the junction is not at the sealed tip of the tube.

What is claimed is:
1. A thermocouple structure comprising:
   a length of tube made from one metal;
   a length of wire made from a dissimilar metal, the length of wire having a smaller diameter than the inside diameter of the tube and extending inside the tube in spaced approximate axial alignment therewith;
   a metallic sleeve fitting around the wire at one end to fill the space between the wire and the tube, the sleeve being formed of a metal different from the tube metal and the wire metal, the difference between the thermoelectric coefficients of the sleeve metal and the wire metal being larger than the difference between the thermoelectric coefficients of the tube metal and the wire metal;
   an electrical connector at the other end of the wire from the sleeve, the connector having first and second mutually insulated electrical paths connected respectively to the opposite end of the tube and the wire from the sleeve;
   at least one thermocouple junction formed between the sleeve and the adjacent portion of the wire; and
   means covering the end of the tube adjacent to the sleeve to seal the tube from the atmosphere.
2. The thermocouple structure of claim 1, in which the sleeve has a closed end where the tip covers the end of the tube.
3. The thermocouple structure of claim 1, in which the thermocouple junction is formed by a spot weld between the sleeve and the wire.
4. The thermocouple structure of claim 1, in which the tube metal is more resistant to oxidation than the sleeve metal.
5. The thermocouple structure of claim 1, in which the sleeve is stainless steel 403, the tube is stainless steel 430, and the wire is a nickel-copper alloy.
6. The thermocouple structure of claim 4, in which the thermocouple junction is formed by a spot weld between the sleeve and the wire.
7. The thermocouple structure of claim 6, in which the sleeve is stainless steel 403, the tube is stainless steel 430, and the wire is a nickel-copper alloy.
8. The thermocouple structure of claim 7, in which the sleeve has a closed end where the tip covers the end of the tube.

* * * * *